United States Patent [19]

Kuroda

[11] Patent Number: 5,518,946
[45] Date of Patent: May 21, 1996

[54] PROCESS FOR FABRICATING CAPACITORS IN DYNAMIC RAM

[75] Inventor: Hideaki Kuroda, Kanagawa, Japan

[73] Assignee: Sony Corporation, Tokyo, Japan

[21] Appl. No.: 203,677

[22] Filed: Feb. 28, 1994

Related U.S. Application Data

[63] Continuation of Ser. No. 957,480, Oct. 7, 1992, abandoned.

[30] Foreign Application Priority Data

Oct. 7, 1991 [JP] Japan ................................. 3-287100

[51] Int. Cl.$^6$ ............................................. H01L 21/8242
[52] U.S. Cl. ............................... 437/52; 437/46; 437/60; 437/241; 437/919; 148/DIG. 112
[58] Field of Search ..................... 437/47, 49, 52, 437/60, 228, 235, 238, 241, 919, 27, 46; 148/DIG. 112, DIG. 114; 257/310

[56] References Cited

U.S. PATENT DOCUMENTS

| | | | |
|---|---|---|---|
| 4,254,161 | 3/1981 | Kemlage | 437/238 |
| 4,266,985 | 5/1981 | Ito et al. | 437/42 |
| 4,990,463 | 2/1991 | Mori | 437/52 |
| 5,032,541 | 6/1991 | Doan et al. | 437/241 |

OTHER PUBLICATIONS

Ando et al. "Ultra thin silicon nitride films prepared by combining rapid thermal nitridation with low pressure chemical vapor deposition" Appl. Phys. Lett. 59.(9), Aug. 26, 1991. pp. 1081–1083.

*Primary Examiner*—Tom Thomas
*Attorney, Agent, or Firm*—Hill, Steadman & Simpson

[57] ABSTRACT

A method for inhibiting generation of a native oxide film on the surface of a dielectric film in the process of fabricating a capacitor for a dynamic RAM is disclosed. A pure polysilicon layer inherently not liable to produce a native oxide film is formed as a lower electrode layer, and a thin thermal nitride film is formed b rapid thermal nitridation on the surface of the pure polysilicon layer. Impurities are then introduced via this thermal nitride layer into the lower electrode layer by ion implantation for rendering the lower electrode layer electrically conductive. Alternatively, an impurity-containing polysilicon layer having a native oxide film on its surface is processed by rapid thermal nitridation for causing a thermal nitride film to be grown at an interface between the native oxide film and the polysilicon layer, after which the surface native oxide film is removed. With both of these method variants, a thicker silicon nitride film is subsequently deposited on the thermal nitride film by a low-pressure CVD method for achieving a predetermined capacitor. Since the film quality of the dielectric film is markedly improved, long-term operational reliability of the dynamic RAM may be improved to diminish the leakage current.

4 Claims, 4 Drawing Sheets

PROCESS FOR FABRICATING CAPACITORS IN DYNAMIC RAM

This is a continuation of application Ser. No. 07/957,480, filed Oct. 7, 1992, now abandoned.

BACKGROUND OF THE INVENTION

This invention relates to a method for fabricating capacitors in a dynamic RAM.

The capacitors in the dynamic RAM function as memory elements in each memory cell, and the quality of the dielectric film constituting the capacitors has crucial significance in improving the operational reliability of the memory elements.

In the capacitors of typical dynamic RAMs, above all, in the stack type capacitors for high integration memories, the dielectric film has a three-layer structure composed of, for example, a silicon oxide film, a silicon nitride film and a second silicon oxide film.

For increasing the capacitance while simultaneously aiming at high integration of the memory cells, it is necessary to form a material with a high dielectric constant into a thin film. A technique for such thin film formation is disclosed in, for example, "Effects of Thermal Nitridation on Underlying layer in $SiO_2/SiN_x$ Structure" in Extended Abstracts of the Japan Society of Applied Physics and Related Societies, 38th Spring Meeting, 1991, page 595, Lecture Number 28p-V-4. According to this technique, an impurity-containing polysilicon layer constituting a lower electrode of the capacitor is processed with rapid thermal nitridation to form a thermal nitride film on its surface.

Meanwhile, if a native oxide film is formed on the surface of a lower electrode layer which is one of the electrodes of the capacitor, the film quality at a boundary to the nitride layer is deteriorated to increase leakage currents and consequently the operational reliability of the dielectric layer. As a technique for forming a high reliability dielectric film, there is known a technique described in JP Patent KOKAI Publication H-3-125473 (1991), according to which a nitride film is first deposited by the low pressure CVD method on the surface of an impurity-free lower electrode layer and impurities are introduced into the lower electrode layer by ion implantation via the nitride film to prevent the native oxide film from being produced.

However, by these prior-art methods, the dielectric film cannot be improved satisfactorily in operational reliability.

First, with the method of generating the thermal nitride film on the surface of the lower electrode layer by the RTN method, a native oxide film is grown as a bottom oxide layer on the surface of the impurity-containing lower electrode layer to deteriorate the long-term reliability of the dielectric film. On this thermal nitride film, a nitride film is stacked by the low-pressure CVD method. Although the oxidation by air entrained into the CVD furnace may be prevented at this time from occurring, a native oxide film is grown during the water-washing step following a hydrofluoric acid treatment as a pre-CVD process, so that the dielectric film is deteriorated inevitably in operational reliability.

On the other hand, with the technique described in the JP Patent Publication No.H-3-125473, damages produced during 1on implantation are left in the nitride film during the time the impurities are introduced by ion implantation into the lower electrode layer which functions as a memory node, thereby again lowering the reliability of the dielectric film.

OBJECT AND SUMMARY OF THE INVENTION

In view of the above-depicted status of the art, it is an object of the present invention to provide a method for fabricating a capacitor for a dynamic RAM whereby a dielectric film having a high operational reliability may be produced.

According to the present invention, the capacitor for the dynamic RAM may be fabricated by the following two method variants.

According to a first method variant, an impurity-free lower electrode layer is formed on a substrate, and a thermal nitride film is then formed on the surface of the lower electrode layer by rapid thermal nitridation. After introducing impurities into the lower electrode layer by ion implantation, a nitride film is stacked on the thermal nitride film by the low-pressure CVD method, and an upper electrode layer is stacked on the nitride film.

It is a well-known phenomenon that a semiconductor film containing impurities to a high concentration undergoes oxidation at a higher rate. However, with this method, since the lower electrode is free of impurities, there is no risk that a native oxide film will be grown excessively on the surface of the lower electrode layer even after e.g. a water-washing step. On the other hand, the thermal nitride film produced with this method is of an extremely thin film thickness, so that, even when impurities are introduced by ion implantation into the lower electrode layer, only little damages are done to the thermal nitride film by the ion implantation. After the ion implantation, another nitride film of a thicker film thickness is stacked on the thermal nitride film to assure a predetermined capacitance. Besides, this nitride film of the thicker film thickness is not affected by deterioration due to ion implantation. Consequently, deterioration in the film quality of the dielectric film in its entirety may be minimized.

According to a second method variant, an impurity-containing lower electrode layer is formed on a substrate and a thermal nitride film is formed by rapid thermal nitridation on the surface of the lower electrode layer. After a native oxide film on the surface of the thermal oxide film is removed, a nitride film is stacked on the thermal nitride film by a low-pressure CVD method, and an upper electrode layer is stacked on the nitride film.

With this method variant, after the thermal nitride film is formed by rapid thermal nitridation, the native oxide surface film produced by the water-washing step is removed. Since the nitride film is formed after removal of the native oxide film, the film quality of the dielectric film is markedly improved to achieve high operational reliability and reduction of the leakage current.

Consequently, the present invention is highly suited to the preparation of a high integration degree dynamic RAM.

DETAILED DESCRIPTION OF THE PREFERRED EMBODIMENTS

Figure 1:
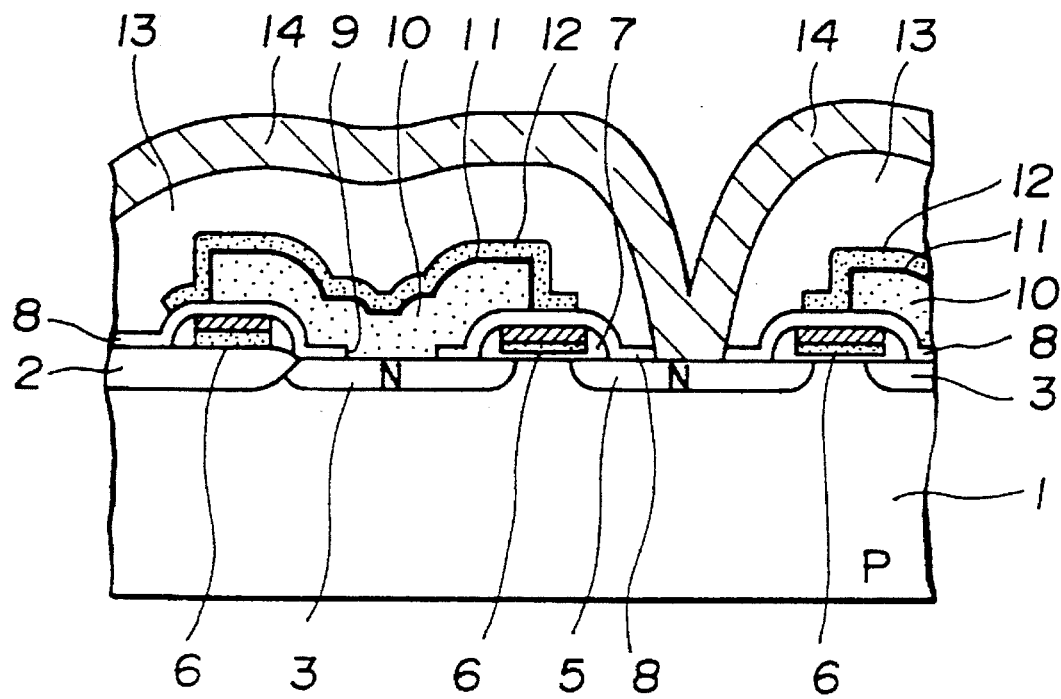
FIG. 1 is a schematic cross-sectional view showing a construction of a memory cell section of a dynamic RAM embodying the present invention.

Referring to the drawings, the present invention will be explained in detail hereinbelow.

[Structure of the Memory Cell Part of Dynamic RAM]

Referring first to FIG. 1, the structure of a dynamic memory RAM having a capacitor formed in accordance with the present invention is explained briefly.

The dynamic RAM is fabricated using a p-type silicon substrate 1, as shown in FIG. 1, and a field oxide film 2 is selectively formed on the surface of the silicon substrate 1 by a selective oxidation method. In the region of the substrate surface on which the field oxide film 2 is not formed, that is, in a device-forming region, a gate electrode 6 which is a word line is formed via a gate oxide film. The gate electrode 6 has a polycide structure which may, for example, be a stacked structure of a polysilicon layer and a tungsten silicide layer.

A MOS transistor of the memory cell section has impurity regions (diffusion regions) 3, 5 formed on the substrate surface in a self-aligned manner with respect to the gate electrode 6. The impurity region 3 is at the side of a memory node, while the impurity region 5 is at a contact side of a bit line common to a pair of cells. A sidewall 7 on a lateral side of the gate electrode 6 is formed at the same time that a peripheral circuit is formed. Therefore, ion implantation may again be carried out after formation of the sidewall 7 for forming a high impurity concentration region in the impurity regions 3, 5 for providing a so-called LDD structure MOS transistor, although this is not done in the present embodiment.

The gate electrode 6 and the sidewall 7 are coated by an interlayer insulating film 8 which is formed on the entire surface of the wafer and which has a contact hole 9 connecting to the impurity region 3. It is via this contact hole 9 that the lower electrode layer 10 consisting in a polysilicon layer of a larger thickness connects to the impurity region 3. The lower electrode layer 10, constituting a memory node, is extended, in the embodiment shown in FIG. 1, in a region defined between the gate electrodes 6, 6 and has its terminal ends on top of the gate electrodes 6, 6.

The lower electrode layer 10 is covered by a dielectric layer 11 which is made up of a silicon nitride film and a silicon oxide film, stacked one upon the other, as discussed in Examples given hereinbelow. The dielectric film 11 has a good film quality and is capable of inhibiting a leakage current to achieve high operational reliability. An upper electrode layer 12, which is a plate electrode, is formed on the dielectric film 11. The upper electrode layer 12 faces the lower electrode layer 10 with the dielectric film 11 in-between.

The memory cell section having the above-described capacitor is coated by an interlayer insulating film 13, such as a reflowable BPSG film, and a bit line 14 is connected to the impurity region 5 at the bottom of a contact hole provided in the interlayer insulating film.

PREFERRED EMBODIMENTS

EXAMPLE 1

Figure 3:
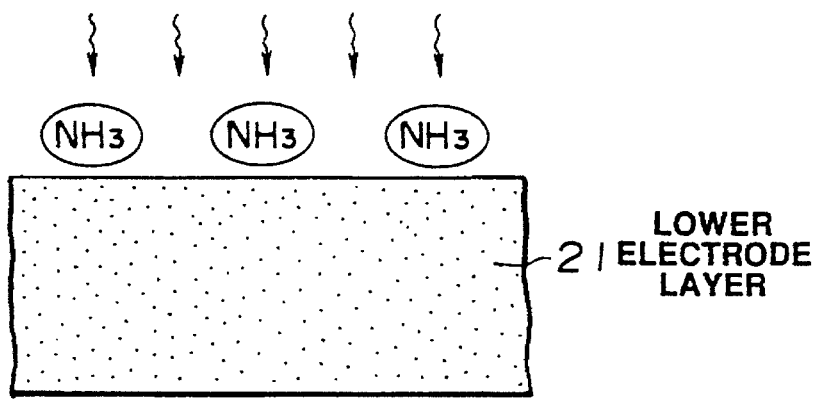
FIG. 3 is a schematic cross-sectional view showing a step of a rapid thermal nitridation for lower electrode layer in the method for fabricating the capacitor according to the first embodiment of the present invention.
Figure 4:
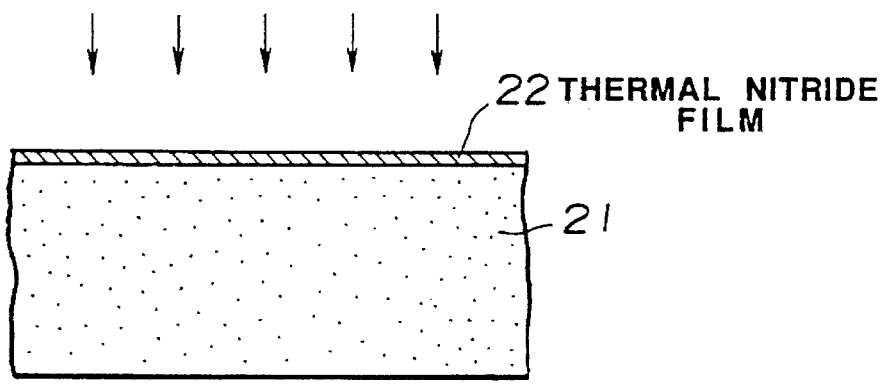
FIG. 4 is a schematic cross-sectional view showing a step of introducing impurities into the lower electrode layer formed by the rapid thermal nitridation by ion implantation.
Figure 5:
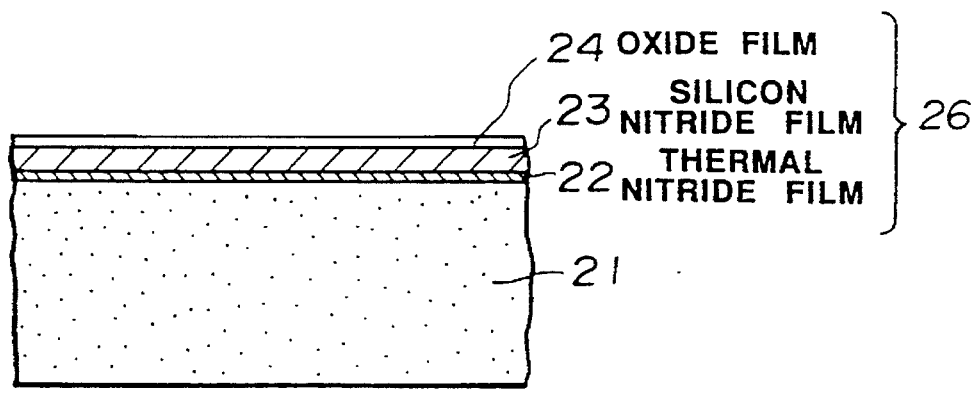
FIG. 5 is a schematic cross-sectional view showing a step of causing a nitride film produced by low-pressure CVD and an oxide film produced by thermal oxidation thereof to be grown on the thermal nitride film.

The present Example is directed to the method of forming a capacitor, more particularly, a stacked type capacitor, in a dynamic RAM. In the present Example, a pure polysilicon layer, that is a layer of polysilicon free of impurities, formed a lower electrode layer and, after forming a thermal nitride film thereon, the lower electrode layer is rendered electrically conductive by ion implantation. The present Example is hereinafter explained by referring to FIGS. 2 to 6 accordance with the process steps of the production process for the dynamic RAM. Of these figures, FIGS. 3 to 5 illustrate the surface of the lower electrode layer of FIG. 2 to an enlarged scale.

Figure 2:
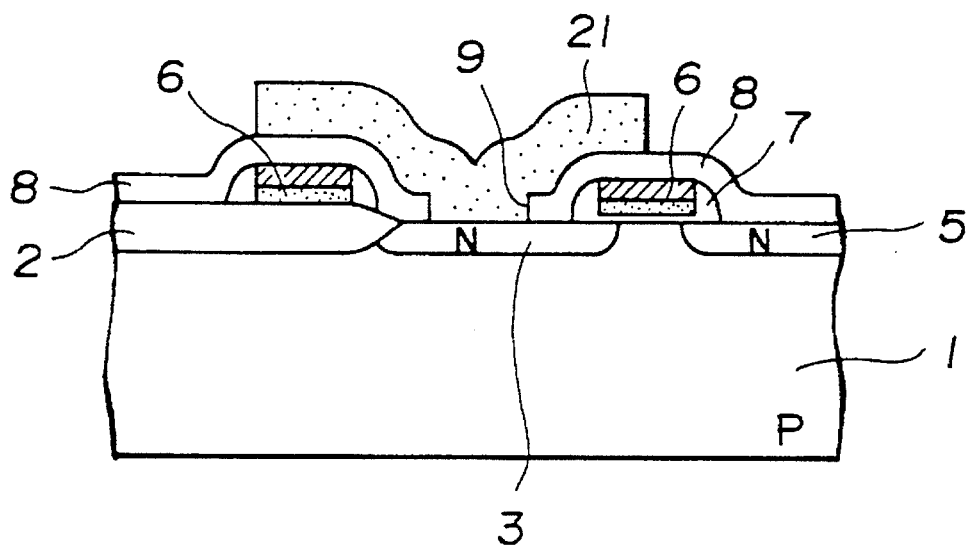
FIG. 2 is a schematic cross-sectional view showing the state in the method for fabricating the capacitor according to a first embodiment of the present invention, in which patterning of the impurity-free lower electrode layer is completed.

FIG. 2 is a schematic view showing the state of a wafer at the time point when the lower electrode layer 21 has been formed for establishing a memory node contact. The process steps up to this time point are explained briefly. First, a field oxide film 2 was formed by the LOCOS method on a silicon substrate 1. A gate oxide film was then formed and a gate electrode 6 was formed on the gate oxide film. The gate electrode 6 was of a tungsten polycide structure or a doped polysilicon layer and was patterned using a photolithographic method and dry etching. Then, using the patterned gate electrode 6 as part of the mask, impurities were introduced into the substrate surface for forming impurity regions 3, 5.

An interlayer insulating film 8 such as that described above was deposited by the CVD method on the entire wafer surface to a film thickness of, for example, an order of tens of nanometers (nm), after which a contact hole 9 reaching the impurity region 3 was formed in the interlayer insulating film 8. The contact hole 9 is formed for establishing the memory node contact. A pure polysilicon layer free of impurities was then deposited of the entire wafer surface. The pure polysilicon layer had a film thickness of the order of tens to hundreds on nanometers (nm) and was formed by the CVD method. The pure polysilicon layer was separated into cells by patterning to produce the lower electrode layer 21 as shown in FIG. 2.

A native oxide film, not shown, formed on the surface of the lower electrode layer 21, was removed by treatment with dilute hydrofluoric acid. Although a small amount of the native oxide film was produced during the water-washing step following the treatment with hydrofluoric acid, it was of an extremely small film thickness of the order of several Angstroms because the lower electrode layer 21 was free of impurities. After drying, the wafer was set on a rapid thermal nitriding unit under an $NH_3$ atmosphere for carrying out a thermal nitridation treatment. For this thermal nitridation treatment, IR rays were radiated on the wafer for heating the wafer surface to a temperature of 1100° C. or higher. By this heating, silicon nitridation proceeded on the surface of the lower electrode layer 21 on the wafer surface, by capturing $NH_3$ contained in atmosphere, so that a thin thermal nitride film was formed on the surface of the electrode layer 21. Strictly speaking, a native oxide film, that is a silicon oxide film, of the order of several Angstroms, was present on the surface of the lower electrode layer 21, this silicon oxide film being nitride to form a thermal nitride layer 22.

Impurities were then introduced into the lower electrode layer 21 by ion implantation via the thermal nitride layer 22, as shown in FIG. 4. The dopant was phosphorus or arsenic and introduced at a dosage of the order of $10^{15}$ to $10^{16}$ cm$^{-2}$ at an energy of tens of keVs. By this ion implantation, the lower electrode layer 21 was rendered electrically conductive and could be operated as one of opposite electrodes of a capacitor.

A silicon nitride film 23 was then deposited on the thermal nitride film 22 by a low-pressure CVD method to a film thickness of several to tens of nanometers (nms). Since the surface of the lower electrode layer 21 was covered by the thermal nitride film 22 in the embodiment illustrated, the native oxide film was scarcely generated by air entrainment when setting the wafer on a CVD furnace maintained at 700° to 800° C. Besides, since the ion implantation into the lower electrode layer 21 was already terminated, the silicon nitride film 23 deposited by the low pressure CVD method was not affected by damages caused by the ion implantation.

The surface of the silicon nitride film 23 was then thermally oxidized to form an oxide film 24, as shown in FIG. 5. When the oxide film 24 was formed in this manner, a dielectric film 26 having a stacked structure of the nitride films (i.e. the thermal nitride film 22 and the silicon nitride film 23) and the oxide film 24 was completed to achieve low leakage current and high operating reliability.

Figure 6:
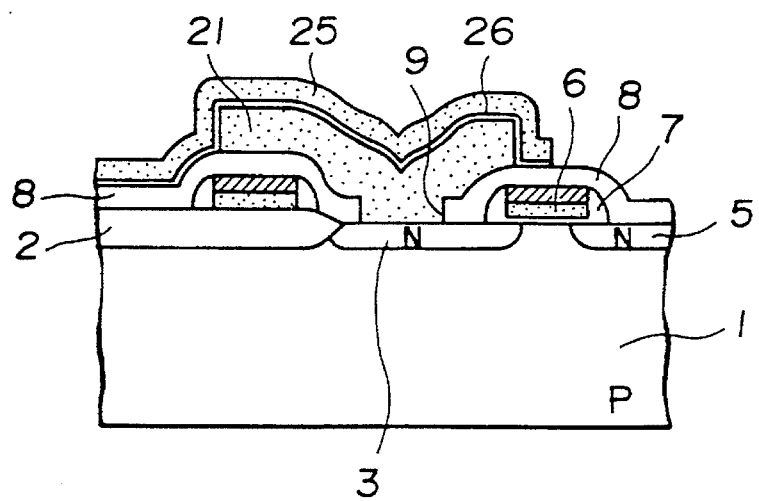
FIG. 6 is a schematic cross-sectional view showing a step of forming an upper electrode layer.

An upper electrode layer 25, as a plate electrode, was then formed on the dielectric film 26, as shown in FIG. 6. The upper electrode layer 25 had a film thickness of an order of hundreds of nanometers (nms). The upper electrode layer 25 was doped with impurities and patterned simultaneously with the dielectric film 26.

The interlayer insulating film, contact hole and the bit lines were then formed in the usual manner to complete the dynamic RAM.

With the above-described method of forming the capacitor, since the surface of the lower electrode layer 21 was covered by the thermal nitride film 22 before forming the silicon nitride film by the low-pressure CVD, the native oxide film was less likely to be produced by air entrainment at the time of introduction into the CVD furnace to improve the film quality of the subsequently formed dielectric film 26. Besides, since impurities were introduced into the lower electrode layer 21 by ion implantation after the formation of the thermal nitride film 22, it was sufficient if the pure polysilicon layer as the lower electrode layer 21 was formed during the rapid thermal nitridation treatment, so that the native oxide layer was scarcely formed on the surface of the lower electrode layer 21. The ion implantation was only through the thin thermal nitride film 22 and a sufficient film thickness was assured by the silicon nitride film which was subsequently formed by the low-pressure CVD method. For this reason, damages caused by the ion implantation to the nitride film were markedly less than in the conventional practice.

EXAMPLE 2

Figure 8:
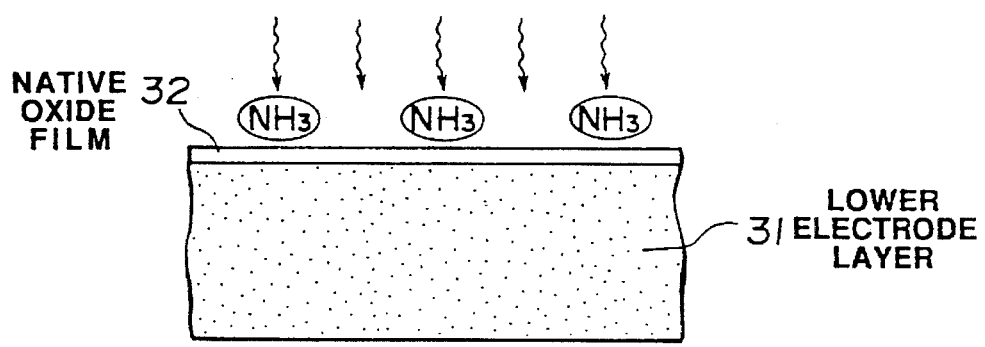
FIG. 8 is a schematic cross-sectional view showing a step of rapid thermal nitridation for the impurity-containing lower electrode layer having a surface native oxide film thereon in the method for fabricating the capacitor according to the second embodiment of the present invention.
Figure 9:
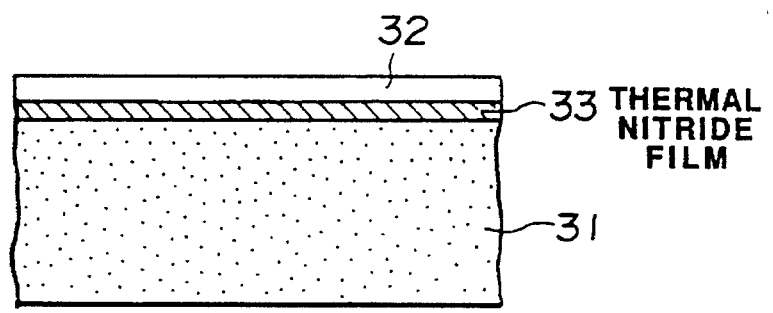
FIG. 9 is a schematic cross-sectional view showing the state in which a thermal nitride film has been formed by the rapid thermal nitridation below the native oxide film.
Figure 10:
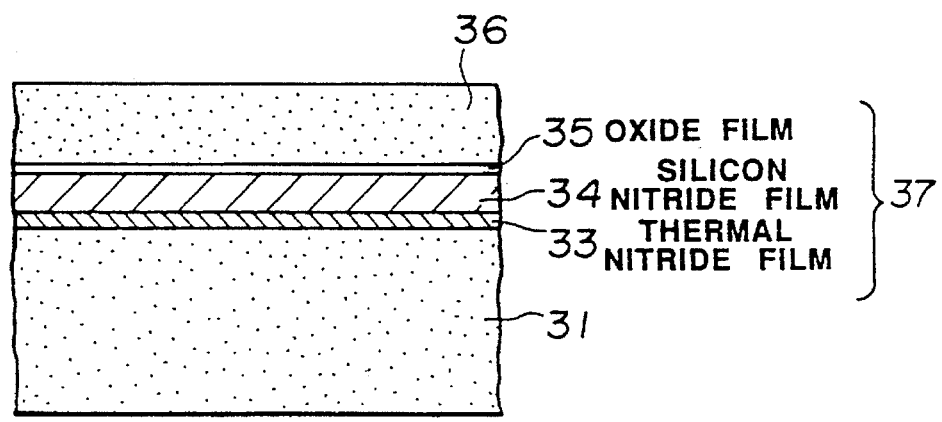
FIG. 10 is a schematic cross-sectional view showing the steps of sequentially forming a nitride film by low-pressure CVD, an oxide film by thermal oxidation and an upper electrode layer on the thermal nitride film after removal of the native oxide film.

In the present Example, the capacitor of the dynamic RAM was fabricated by first forming an impurity-containing polysilicon layer as a lower electrode layer, removing the surface native nitride film by treatment with hydrofluoric acid following the formation of a thermal nitride film and depositing a silicon nitride film by the low-pressure CVD method. Referring to FIGS. 7 to 11, the present Example is explained in the order of the steps of the production process for the dynamic RAM. Of these figures, FIGS. 8 to 10 illustrate the surface of the lower electrode layer to an enlarged scale.

Figure 7:
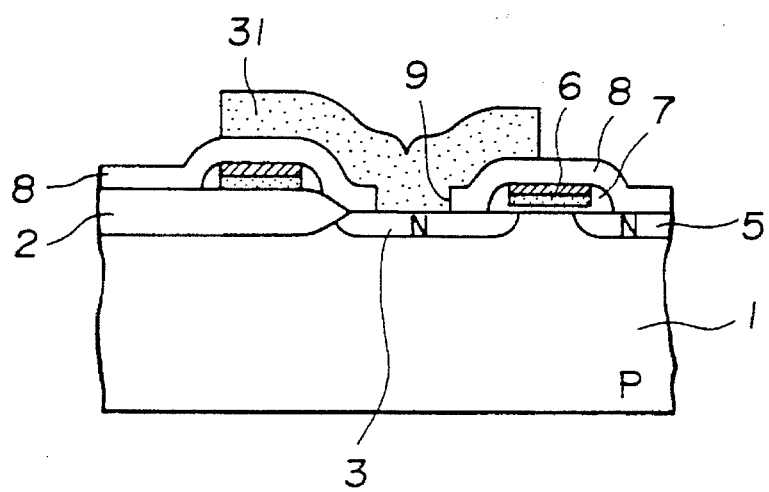
FIG. 7 is a schematic cross-sectional view showing the state in the method for fabricating the capacitor according to a second embodiment of the present invention in which patterning of a lower electrode layer is completed.

FIG. 7 shows, in a schematic cross-sectional view, the state of a wafer at the time point when a lower electrode layer 31, as a memory node, has been formed. The process up to this step is substantially the same as that explained in Example 1. However, the lower electrode layer 31 of the present Example was a polysilicon layer which was deposited by the low-pressure CVD method and into which phosphorus or arsenic was subsequently doped to a high concentration by a pre-deposition method or an ion-implantation method making use of $POCl_3$. After the doping, the polysilicon layer was patterned in the shape of a memory node separated into cells to complete the lower electrode layer 31.

The wafer was then treated with dilute hydrofluoric acid for removing the native oxide film, not shown, on the surface of the lower electrode layer 31. The resulting wafer was then washed with water and dried. By this water-washing step, the surface of the lower electrode layer 31 was again oxidized o form a native oxide film 32.

The wafer was then processed by rapid thermal nitridation consisting in irradiating the wafer surface with IR rays in an $NH_3$ atmosphere, as shown in FIG. 8, so that the wafer surface reached the temperature of 800° C. or higher.

The nitriding reaction at this time proceeded at an interface between the lower electrode layer 31 and the native oxide film 32 generated by the water-washing step following the treatment with dilute hydrofluoric acid, until ultimately a thermal nitride film 33 was formed between the native oxide film 32 and the lower electrode layer 31 as shown in FIG. 9.

The thermal nitride film 33 formed by the rapid thermal nitridation had a film thickness not more than 3 nms which is not sufficient as the film thickness for the dielectric layer. Therefore, it was necessary to deposit a silicon nitride film further and, as a pre-step, to remove the native oxide film 32 by dilute hydrofluoric acid. The native oxide film 32 could be removed by dilute hydrofluoric acid having a concentration of 1 to 10 wt % or $NH_4F$ containing 1 to 10 wt % of hydrofluoric acid. After removal of the native oxide film 32, the thermal nitride film 33 was exposed on the surface of the lower electrode layer 31. At this time point, the native oxide film in the vicinity of the capacitor was removed substantially completely.

The wafer was then washed with water. Since the surface of the lower electrode layer 31 was completely covered with the thermal nitride film 33, there was no risk of any native oxide film being grown on the surface of the lower electrode layer 31.

After the water-washing, the wafer was dried, and a silicon nitride film 34 was deposited by the low-pressure CVD method to a film thickness of the order of several to tens of nanometers (nms). Since the lower electrode layer 31 was coated with the thermal nitride film 33, as discussed previously, a native oxide film was scarcely produced by air entrainment which might be produced when the wafer was introduced into a CVD furnace.

The surface of the silicon nitride film 34 was then thermally oxidized to form an oxide film 35, as shown in FIG. 10. In this manner, a dielectric film 37, having a stacked structure of the thermal nitride film 33, silicon nitride film 34 and the oxide film 35, was formed to achieve the low leakage current and high operational reliability.

Figure 11:
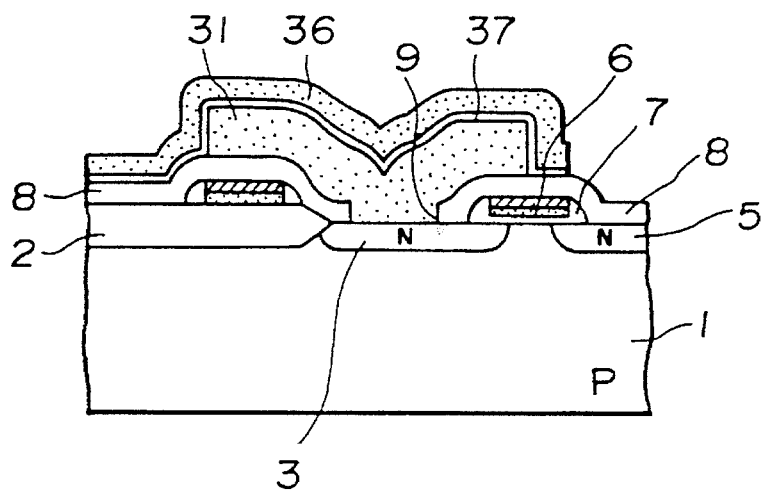
FIG. 11 is a schematic cross-sectional view showing the state in which patterning of the upper electrode layer is completed.

An upper electrode layer 36, as a plate electrode, was then formed on the dielectric layer 37, as shown in FIG. 11. For forming the upper electrode layer 36, which had the film thickness of the order of hundreds of nanometers, it was deposited by CVD and doped with impurities using a pre-deposition method with $POCl_3$, followed by patterning.

An interlayer insulating film, contact holes and bit lines etc. were then formed as conventionally for completing the dynamic RAM.

With the method for forming the capacitor for the dynamic RAM of the embodiment illustrated, the thermal nitride film 33 was grown at an interface between the native oxide film 32 and the lower electrode layer 31, while the native oxide film 32 could be removed by treatment with hydrofluoric acid after the formation of the thermal nitride film 33, so that there is not any native oxide film left above or below the thermal nitride film 33 and consequently the low leakage current and long-term operational reliability may be achieved.

What is claimed is:

1. A method for fabrication of a capacitor in a dynamic RAM, comprising the steps of:

forming an impurity-free polycrystalline silicon lower electrode layer on a substrate, forming a first nitride film on the surface of said lower electrode layer by rapid thermal nitridation, introducing phosphorous or arsenic impurities into said lower electrode layer by ion implantation through said first nitride film, stacking a second nitride film on said first nitride film by a low pressure CVD method and said second nitride film being thicker than said first nitride film, and stacking an upper electrode layer on said second nitride film, and wherein said upper electrode layer is stacked after forming an oxide film by thermal oxidation on the surface of said second nitride film.

2. A method as in claim 1 wherein said rapid thermal nitridation is conducted at a temperature greater than 1100° centigrade.

3. A method as in claim 1 wherein said low-pressure CVD is conducted at about 700–800 degrees centigrade.

4. A method according to claim 1 wherein said phosphorous or arsenic is introduced at a dosage of $10^{-5}$ to $10^{-16}$ $cm^{-2}$.

* * * * *